United States Patent [19]

Anthony et al.

[11] Patent Number: 5,310,447
[45] Date of Patent: May 10, 1994

[54] SINGLE-CRYSTAL DIAMOND OF VERY HIGH THERMAL CONDUCTIVITY

[75] Inventors: Thomas R. Anthony, Schenectady; William F. Banholzer, Glenville; James F. Fleischer, Scotia, all of N.Y.

[73] Assignee: General Electric Company, Worthington, Ohio

[21] Appl. No.: 744,815

[22] Filed: Aug. 12, 1991

Related U.S. Application Data

[63] Continuation of Ser. No. 448,469, Dec. 11, 1989, abandoned.

[51] Int. Cl.$^5$ .............................................. C30B 29/04
[52] U.S. Cl. ........................................ 423/446; 117/41; 117/64; 117/79; 117/915
[58] Field of Search ................... 156/610, DIG. 68; 423/446; 561/86; 427/39, 577

[56] References Cited

U.S. PATENT DOCUMENTS

| | | | |
|---|---|---|---|
| 3,895,313 | 7/1975 | Seitz | 331/945 D |
| 4,034,066 | 7/1977 | Strong et al. | 423/446 |
| 4,073,380 | 2/1978 | Strong et al. | |
| 4,434,188 | 2/1984 | Kamo et al. | 423/448 |
| 4,544,540 | 10/1985 | Tsuji | 156/DIG. 68 |
| 4,617,181 | 10/1986 | Yazu et al. | 423/446 |
| 4,816,286 | 3/1989 | Hirose | 423/446 |

FOREIGN PATENT DOCUMENTS

| | | | |
|---|---|---|---|
| 206820 | 6/1986 | European Pat. Off. | |
| 58-110494 | 7/1983 | Japan | 423/446 |
| 60-112699 | 6/1985 | Japan | 423/446 |
| 60-118694 | 6/1985 | Japan | 501/86 |
| 60-121271 | 6/1985 | Japan | 501/86 |

OTHER PUBLICATIONS

Stromberg et al. "Sintering of Diamond at 1800°c-1900°c and 60-65 KBar", American–Ceramic Bulletin, vol. 49, No. 12 (1970) pp. 1030–1032.

Davies, Diamond (Bristol, England: Adam Hilger Ltd.), 1984, p. 138.

Seitz, "Isotropic Enhancement of Thermal Conductivity and Damage Thresholds in Diamond" papers given Feb. 6, 1987, at Lincoln Laboratories.

Berman et al., Diamond Research, 1976, 7–13, month unknown.

Seitz, SPIE vol. 969 Diamond Optics, 124, 127–137 (1988) month unknown.

Primary Examiner—Robert Kunemund

[57] ABSTRACT

Single-crystal diamond consisting of isotopically pure carbon-12 or carbon-13 has been found to have a thermal conductivity higher than that of any substance previously known, typically at least 40% higher than that of naturally occurring IIA diamond. It may be prepared by a method comprising an initial step of low pressure chemical vapor deposition employing an isotopically pure hydrocarbon in combination with hydrogen, followed by comminution of the diamond thus obtained and conversion thereof to single-crystal diamond under high pressure conditions.

23 Claims, No Drawings

SINGLE-CRYSTAL DIAMOND OF VERY HIGH THERMAL CONDUCTIVITY

This application is a Continuation of application Ser. No. 07/448,469, filed Dec. 11, 1989 now abandoned.

This invention relates to the preparation of single crystal diamond of extremely high thermal conductivity.

Diamond substances with high thermal conductivity are known in the art. For example, type IIA natural diamond, characterized by a very high degree of purity, has a thermal conductivity at 25° C. (298° K.) on the order of 21 watts/cm.°K. Under ideal conditions, therefore, such diamond would be useful as a heat sink material.

An example of an area in which heat sinks of very high thermal conductivity are necessary is in repeating stations for fiber optic networks. Signals are transmitted by laser light over the fibers of such networks for very great distances. Since these signals decrease substantially in intensity over several kilometers, it is necessary to construct "repeating stations" periodically along the network, for the purpose of increasing the intensity of the light transmitted along the network. In a typical repeating station of this type, a photodetector is employed to convert the weakened signal transmitted by fiber optics to an electrical signal, which is then magnified, reconverted to a light signal by a light-emitting diode, and transmitted in turn along the next segment of the network.

In order to minimize the requisite number of repeating stations, optimum magnification of the signal in any station is desirable. However, the amount of radiant energy of any kind generated electrically is proportional to the fourth power of the current employed. While a portion of such radiant energy is in the form of light, the remainder thereof is lost as heat. In any individual station, therefore, very large amounts of heat are generated, requiring efficient heat sinks to maintain the operativeness of the repeating station.

For the most part, the operative units in these repeating stations are very small, typically about 1 mm. on a side. The area of the requisite heat sink is therefore not unduly large.

Despite its high cost, natural type IIA diamond has been employed as a heat sink material because it has the highest known thermal conductivity. Conventionally produced high-pressure synthetic diamond is lower in cost but cannot effectively be produced with a similarly high thermal conductivity from graphite because a profound contraction in volume occurs in the conversion and introduces imperfections into the crystalline structure. For the most part, diamonds prepared by low-pressure chemical vapor deposition (hereinafter sometimes "CVD") processes are not single crystal diamond and have materially lower thermal conductivities, typically on the order of 12 watts/cm.°K. at about 300° K. (hereinafter sometimes "room temperature conductivity").

In U.S. Pat. No. 3,895,313, there are disclosed various diamond materials which allegedly have very high thermal conductivities, and which allegedly are useful as optical elements for very high-power laser beams. In particular, it is stated that synthetic diamonds grown from isotopically pure carbon-12 or carbon-13 would be useful in this way, with room temperature conductivity values in the range of 10-20 watts/cm. °K. being mentioned. This is, of course, the order of magnitude of natural type IIA diamond and also of diamond produced by chemical vapor deposition. It is further suggested that at a temperature of 70° K. (−203° C.), the temperature of liquid nitrogen, a thermal conductivity exceeding 200 watts/cm.°K. may be obtained, perhaps in diamonds which have high isotopic purity and "relevant properties which closely approach the limits predicted by the theory of the perfect solid state" (i.e., are in single-crystal form). However, no methods for the preparation of such diamonds are suggested, and the state of the art has hitherto been inadequate to put them in the possession of the public.

The present invention provides a method for preparing single-crystal diamonds of very high chemical and isotopic purity. The raw material for such diamond is itself diamond, which eliminates the volume contraction encountered in the high-pressure conversion of graphite to diamond. The thermal conductivity of the diamond so produced has been found to be higher than that of any substance presently known, and also higher than the values in the aforementioned U.S. Pat. No. 3,895,313. Accordingly, it is eminently suitable for use as a heat sink material.

In one of its aspects, therefore, the invention is a method for preparing isotopically pure single-crystal diamond which comprises the steps of:

(A) depositing a layer of diamond on a substrate by a chemical vapor deposition method comprising low pressure activation of a mixture of hydrogen and a hydrocarbon consisting of isotopically pure carbon-12 or carbon-13;

(B) removing and comminuting said diamond layer; and (C) converting the comminuted diamond to single-crystal diamond by diffusion under high pressure through a metallic catalyst-solvent material to a region containing a diamond seed crystal.

In step A of the method of this invention, a layer of CVD diamond is deposited on at least one substrate. Any substrate material suitable for diamond deposition thereon may be employed; examples of such materials are boron, boron nitride, platinum, graphite, molybdenum, copper, aluminum nitride, silver, iron, nickel, silicon, alumina and silica, as well as combinations thereof. Metallic molybdenum substrates are particularly suitable under many conditions and are often preferred.

The method of chemical vapor deposition of diamond on a substrate is known, and the details need not be repeated herein. In brief, it requires high-energy activation of a mixture of hydrogen and a hydrocarbon, typically methane, whereupon the hydrogen gas is converted to atomic hydrogen which reacts with the hydrocarbon to form elemental carbon. Said carbon then deposits on the substrate in the form of diamond. Activation may be achieved by conventional means involving high-energy activation which produces atomic hydrogen from molecular hydrogen; such means include thermal means typically involving heated filaments, flame means, D.C. discharge means and radiation means involving microwave or radio-frequency radiation or the like.

Thermal and especially filament methods, employing one or more resistance heating units including heated wires or filaments, are often preferred for the purposes of this invention. In such methods, the filaments are typically of metallic tungsten, tantalum, molybdenum and rhenium; because of its relatively low cost and particular suitability, tungsten is often preferrred. Filament diameters of about 0.2–1.0 mm. are typical, with about 0.8 mm. frequently being preferred. Distances from filaments to substrate(s) are generally on the order of 5–10 mm.

Said filaments are typically heated at temperatures of at least 2000° C. and the optimum substrate temperature is in the range of 900°–1000° C. The pressure in the deposition vessel is maintained up to about 760 torr, typically on the order of 10 torr. The hydrogen-hydrocarbon mixture generally contains hydrocarbon in an amount up to about 2% by volume based on total gases. For a description of illustrative CVD methods of diamond preparation, reference is made to copending, commonly owned applications Ser. Nos. 07/389,210 and 07/389,212.

An essential feature of the method of this invention is the employment of a hydrocarbon consisting of isotopically pure carbon-12 or carbon-13. As explained hereinafter, it has been found that the increase in thermal conductivity resulting from the employment of chemically and isotopically pure carbon is vastly greater than would be expected based on theoretical considerations. In general, the isotopic purity of the hydrocarbon should be at least 99.9% by weight; that is, the other isotope should be present in a maximum amount of 1 part per 1000. The hydrocarbon should also have a high degree of chemical purity.

In order to avoid contamination of the isotopically pure hydrocarbon, it is essential to employ equipment which does not contain natural carbon as an impurity. For this purpose, the CVD chamber should be constructed of materials substantially incapable of dissolving carbon. Typical materials of this type are quartz and copper.

As between carbon-12 and carbon-13, the former is highly preferred for various reasons. In the first place, carbon-12 is present in nature in much higher proportions than carbon-13, the latter typically occurring in amounts no higher than about 1% by weight; therefore, the use of carbon-12 involves a minimum of expense. In the second place, thermal conductivity is inversely proportional to the square of the mass number of the isotope, and diamonds prepared from carbon-12 can therefore be expected to have thermal conductivities about 17% greater than those prepared from carbon-13.

The thickness of the diamond layer deposited on the substrate in step A is not critical. In general, it is convenient to deposit at least as much diamond as will be needed to produce a single crystal of the desired size. Of course, the production of a larger amount of CVD diamond for use to make several crystals is also contemplated.

In step B, the diamond layer is removed from the substrate and comminuted. Comminution may be achieved by art-recognized means such as crushing and powdering. It is usually preferred to achieve a particle size in step B similar to that of graphite employed in conventional high-pressure diamond production processes.

Step C is a step of conventional high-pressure production of single crystal diamond, with the exception that the diamond which is the product of steps A and B is the raw material employed. Two things are achieved by using diamond rather than graphite as the raw material: an easily obtained isotopically pure material may be employed, and the contraction in volume encountered in the conversion of graphite to diamond is avoided, permitting production of a single crystal of regular structure and high quality.

The process for producing single-crystal diamond under high pressure is also known in the art, and a detailed description thereof is not deemed necessary. Reference is made, for example, to *Encyclopedia of Physical Science & Technology*, vol. 6, pp. 492–506 (Academic Press, Inc., 1987); Strong, *The Physics Teacher*, January 1975, pp. 7–13; and U.S. Pat. Nos. 4,073,380 and 4,082,185, for general descriptions of the process. It generally involves diffusion of the carbon employed as a source material through a liquid bath of a metallic catalyst-solvent material, at pressures on the order of 50,000–60,000 atmospheres and temperatures in the range of about 1300°–1500° C. A negative temperature gradient, typically of about 50° C., is preferably maintained between the material being converted and the deposition region, which contains a diamond seed on which crystal growth can begin.

Catalyst-solvent materials useful in step C are known in the art. They include, for example, iron; mixtures thereof with nickel, aluminum, nickel and cobalt, nickel and aluminum, and nickel, cobalt and aluminum; and mixtures of nickel and aluminum. Iron-aluminum mixtures are frequently preferred for the production of single-crystal diamond, with a material consisting of 95% (by weight) iron and 5% aluminum being particularly preferred for the purposes of the invention.

Following preparation of the single-crystal diamond by the method of this invention, it is often preferred to remove the portion attributable to the seed crystal by polishing. This is particularly true if the seed crystal is not isotopically pure.

The single-crystal diamonds obtained by the method of this invention consist of at least 99.9% by weight isotopically pure carbon-12 or carbon-13 and have a room temperature conductivity at least 40% greater than that of natural type IIA diamond. At lower temperatures, even higher differences in thermal conductivity are to be expected. Such thermal conductivities are higher than those of any material previously known. Single-crystal diamonds of this type, as well as those in general prepared by the method of this invention, are other aspects of the invention.

The reasons for the extremely high thermal conductivity of the single-crystal diamonds of this invention are not fully understood. It is assumed, however, that the phenomenon is principally a function of the mean free path of the phonons (i.e., lattice vibration modes) in the diamond crystals. Thermal conductivity is directly proportional to specific heat, sound velocity in and phonon mean free path of the crystal, and isotope effects on specific heat and sound velocity are negligible.

In a simplified calculation, the reciprocal of the phonon mean free path can be considered as equal to the sums of the reciprocals of the mean free paths attributable to phonon-phonon scattering and to isotope effects. It has been calculated that the isotope-related mean free path is 34,000 Angstroms and the phonon scattering-related path is 1900 Angstroms; consequently, the reciprocal of the value for isotope effect is nearly negligible in calculation of the overall mean free path. One possible reason for the profound isotope effect on thermal conductivity is that contrary to theory, the isotopic constitution of the diamond has a direct effect on the mean free path attributable to phonon-phonon scattering. This effect has apparently not been previously recognized.

The invention is illustrated by an example in which a layer of CVD diamond was first deposited on a molybdenum substrate in a chamber constructed of quartz and copper, neither of which dissolves substantial amounts of carbon. The substrate was vertically disposed in a plane parallel to and 8–9 mm. distant from the plane of a tungsten filament about 0.8 mm. in diameter. The vessel was evacuated to a pressure of about 10 torr, the filaments were heated by passage of an electric current to about 2000° C. and a mixture of 98.5% (by volume) hydrogen and 1.5% methane was passed into the vessel. The methane employed was substantially impurity-free and 99.9% thereof contained the C-12 isotope of carbon. Upon removal and mass spectroscopic analysis of the diamond thus obtained, it was found that 99.91% of the carbon therein was the C-12 isotope.

Thermal conductivity of the isotopically pure CVD diamond was measured by the mirage detection of thermal waves generated by a modulated argon-ion beam impinging on the diamond crystals, in accordance with a conventional method. The room temperature conductivity was shown to be about 12 watts/cm.°K. A control sample of similar CVD diamond prepared from methane having the naturally occurring isotope distribution (98.96% C-12, 1.04% C-13) had essentially the same conductivity.

The isotopically pure CVD diamond was crushed and powdered, and was used as a source of carbon for the growth of a single-crystal diamond under high pressure and high temperature conditions. Specifically, a conventional belt apparatus was employed at 52,000 atmospheres and 1400° C., employing a catalyst-solvent mixture of 95% (by weight) iron and 5% aluminum. A small (0.005 carat) single-crystal diamond seed of normal isotopic distribution was used to initiate growth, and a negative temperature gradient of about 50° C. was maintained between the CVD diamond and the seed crystal. The process was continued until a single crystal of 0.95 carat had been produced. It was shown by analysis that 99.93% of the carbon therein was the C-12 isotope.

The diamond was polished on a standard diamond scaife to remove the seed crystal, and its room temperature conductivity was compared with those of several other materials, including a control single-crystal diamond prepared from the CVD diamond with normal isotope distribution. The results were as follows, all values being in watts/cm.°K.:

| | |
|---|---|
| Isotopically pure C-12 diamond (this invention) | 31.5 |
| Control | 21.18 |
| Naturally occurring type IIA diamond | 21.2 |
| CVD diamond | 12.0 |
| Cubic boron nitride | 7.6 |
| Silicon carbide | 4.9 |
| Copper | 4.0 |
| Beryllium oxide | 3.7 |
| Boron phosphide | 3.6 |
| Aluminum nitride | 3.2 |
| Silicon | 1.6 |
| Aluminum oxide | 0.2 |

Thus, the room temperature conductivity of the diamond of this invention is 48.7% greater than that of the control. It is also much higher than the room temperature conductivity of any other diamond or non-diamond material which has been measured.

At 70° K., the temperature of liquid nitrogen, the diamond of the present invention is projected to have a conductivity of about 2675 watts/cm.°K., more than 13 times the minimum value predicted in the aforementioned U.S. Pat. No. 3,895,313.

What is claimed is:

1. A method for preparing isotopically pure single-crystal diamond having a thermal conductivity of at least 31.5 watts/cm.°K. at 300° K. which comprises the steps of:
    (A) depositing a layer of diamond on a substrate by a chemical vapor deposition method comprising low pressure activation of a mixture of hydrogen and a hydrocarbon consisting of isotopically pure carbon-12 or carbon-13;
    (B) removing and comminuting said diamond layer; and
    (C) converting the comminuted diamond to single-crystal diamond by diffusion under high pressure through a metallic catalyst-solvent material to a region containing a diamond seed crystal.

2. A method according to claim 1 wherein the carbon in the hydrocarbon is carbon-12.

3. A method according to claim 2 wherein thermal activation is employed in step A.

4. A method according to claim 3 wherein the carbon in the hydrocarbon is at least 99.9% isotopically pure.

5. A method according to claim 4 wherein thermal activation in step A is achieved by one or more heated wires or filaments.

6. A method according to claim 5 wherein the equipment employed in step A is constructed of materials substantially incapable of dissolving carbon.

7. A method according to claim 4 wherein the particle size achieved in step B is similar to that of graphite employed in conventional high-pressure diamond production processes.

8. A method according to claim 7 wherein step A is conducted at a filament temperature of at least 2000° C., a substrate temperature in the range of 900°–1000° C. and a pressure of about 10 torr.

9. A method according to claim 8 wherein the filaments are of tungsten and the substrate is molybdenum.

10. A method according to claim 4 wherein the catalyst-solvent material employed in step C is an iron-aluminum mixture.

11. A method according to claim 10 wherein a negative temperature gradient is maintained in step C between the material being converted and the deposition region.

12. A method according to claim 11 wherein the catalyst-solvent material employed in step C is a mixture of 95% iron and 5% aluminum by weight.

13. A method according to claim 12 wherein the temperature gradient is about 50° C.

14. A method according to claim 11 wherein the pressure in step C is in the range of 50,000–60,000 atmospheres and the temperature is in the range of about 1300°–1500° C.

15. A method according to claim 14 wherein the seed crystal is single-crystal diamond of normal isotopic distribution.

16. A method according to claim 15 wherein the portion of the product diamond attributable to the seed crystal is removed by polishing.

17. A single-crystal diamond consisting of at least 99.9% by weight isotopically pure carbon-12 or carbon-13, said diamond having a thermal conductivity of at least 31.5 watts/cm.°K. at 300° K.

18. A diamond according to claim 17 which consists of carbon-12.

19. A single-crystal diamond prepared by the method of claim 1.

20. A single-crystal diamond prepared by the method of claim 2.

21. A method for preparing isotopically pure single-crystal diamond having a thermal conductivity of at least 31.5 watts/cm.°K. which comprises the steps of:
  (A) depositing a layer of at least 99.9% isotopically pure carbon-12 or carbon-13 diamond on a substrate by chemical vapor deposition, and
  (C) converting said isotopically pure diamond to single-crystal diamond by diffusion under high pressure through a metallic catalyst-solvent material to a region containing a diamond seed crystal.

22. A single-crystal diamond having a thermal conductivity of at least 31.5 watts/cm.°K. at 300° K.

23. A method for preparing isotopically pure single-crystal diamond having a thermal conductivity of at least 31.5 watts/cm.°K. at 300° K. which comprises the steps of:
  (A) producing isotopiclaly pure diamond at low pressure; and
  (B) converting said diamond into single-crystal diamond at high pressure.

* * * * *